(12) United States Patent
Hsia et al.

(10) Patent No.: US 9,871,150 B1
(45) Date of Patent: Jan. 16, 2018

(54) PROTECTIVE REGION FOR METALLIZATION OF SOLAR CELLS

(71) Applicant: SUNPOWER CORPORATION, San Jose, CA (US)

(72) Inventors: Benjamin Ian Hsia, Fremont, CA (US); David Aaron Randolph Barkhouse, Menlo Park, CA (US); Todd Richards Johnson, San Jose, CA (US); Michael Cudzinovic, Sunnyvale, CA (US)

(73) Assignee: SunPower Corporation, San Jose, CA (US)

( * ) Notice: Subject to any disclaimer, the term of this patent is extended or adjusted under 35 U.S.C. 154(b) by 0 days.

(21) Appl. No.: 15/201,324

(22) Filed: Jul. 1, 2016

(51) Int. Cl.
*H01L 31/0224* (2006.01)
*H01L 31/18* (2006.01)
*H01L 31/0216* (2014.01)
*H01L 31/068* (2012.01)
*H01L 31/0236* (2006.01)
*H01L 31/0232* (2014.01)

(52) U.S. Cl.
CPC ........... *H01L 31/022441* (2013.01); *H01L 31/02168* (2013.01); *H01L 31/02327* (2013.01); *H01L 31/02363* (2013.01); *H01L 31/0682* (2013.01); *H01L 31/1864* (2013.01); *Y02E 10/50* (2013.01); *Y02E 10/547* (2013.01)

(58) Field of Classification Search
CPC .................. H01L 31/022441; H01L 31/022425–31/022458
See application file for complete search history.

(56) References Cited

U.S. PATENT DOCUMENTS

| | | | |
|---|---|---|---|
| 2014/0174518 A1* | 6/2014 | Wu | H01L 31/022425 136/256 |
| 2014/0179056 A1* | 6/2014 | Morse | H01L 31/022425 438/97 |
| 2014/0261671 A1* | 9/2014 | Zhu | H01L 31/022425 136/256 |
| 2015/0090326 A1* | 4/2015 | Sewell | H01B 1/023 136/256 |
| 2015/0090327 A1* | 4/2015 | Sewell | H01B 1/02 136/256 |
| 2015/0090330 A1* | 4/2015 | Sewell | H01L 31/022425 136/256 |
| 2015/0179836 A1* | 6/2015 | Sewell | H01L 31/022441 136/256 |
| 2016/0163901 A1 | 6/2016 | Hsia et al. | |

\* cited by examiner

*Primary Examiner* — Victor A Mandala
*Assistant Examiner* — Regan J Rundio
(74) *Attorney, Agent, or Firm* — Schwabe, Williamson & Wyatt, P.C.

(57) ABSTRACT

Methods of fabricating a solar cell including metallization techniques and resulting solar cells, are described. In an example, a first and second semiconductor regions can be formed in or above a substrate, where a separation region is disposed between the first and second semiconductor regions. A protective region can be formed over the separation region. A first metal layer can be formed over the substrate, where the protective region prevents and/or inhibits damage to the separation region during the formation of the first metal layer. Conductive contacts can be formed over the first and second semiconductor regions.

17 Claims, 9 Drawing Sheets

PROTECTIVE REGION FOR METALLIZATION OF SOLAR CELLS

BACKGROUND

Photovoltaic (PV) cells, commonly known as solar cells, are devices for conversion of solar radiation into electrical energy. Generally, solar radiation impinging on the surface of, and entering into, the substrate of a solar cell creates electron and hole pairs in the bulk of the substrate. The electron and hole pairs migrate to p-doped and n-doped regions in the substrate, thereby creating a voltage differential between the doped regions. The doped regions are connected to the conductive regions on the solar cell to direct an electrical current from the cell to an external circuit. When PV cells are combined in an array such as a PV module, the electrical energy collected from all of the PV cells can be combined in series and parallel arrangements to provide power with a certain voltage and current.

Efficiency is an important characteristic of a solar cell as it is directly related to the capability of the solar cell to generate power. Likewise, efficiency in producing solar cells is directly related to the cost effectiveness of such solar cells. Accordingly, techniques for increasing the efficiency in the manufacture of solar cells, are generally desirable.

DETAILED DESCRIPTION

The following detailed description is merely illustrative in nature and is not intended to limit the embodiments of the subject matter of the application or uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology

The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. §112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" semiconductor region does not necessarily imply that this semiconductor region is the first semiconductor region in a sequence; instead the term "first" is used to differentiate this semiconductor region from another semiconductor region (e.g., a "second" semiconductor region).

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

In the following description, numerous specific details are set forth, such as specific operations, in order to provide a thorough understanding of embodiments of the present disclosure. It will be apparent to one skilled in the art that embodiments of the present disclosure may be practiced without these specific details. In other instances, well-known techniques are not described in detail in order to not unnecessarily obscure embodiments of the present disclosure.

Approaches to prevent and/or inhibit solar cell performance degradation induced during metallization processes are described herein. Embodiments of the present disclosure include the formation of a protective region over portions of a solar cell to prevent and/or inhibit impingement of energetic ions and/or ionizing radiation into the solar cell during a metallization process. In an example, protective regions can be used to inhibit charge carrier lifetime degradation over a trench and/or passivation region of a solar cell during a metal sputter deposition process.

Methods for metallization of solar cells and the resulting solar cells are also described herein. In the following description, numerous specific details are set forth, such as specific solar cell structures and process flow operations, in order to provide a thorough understanding of embodiments of the present disclosure. It will be apparent to one skilled in the art that embodiments of the present disclosure may be practiced without these specific details. In other instances, well-known fabrication techniques, such as lithography and patterning techniques, are not described in detail in order to not unnecessarily obscure embodiments of the present disclosure. Furthermore, it is to be understood that the various embodiments shown in the figures are illustrative representations and are not necessarily drawn to scale.

Figure 1:
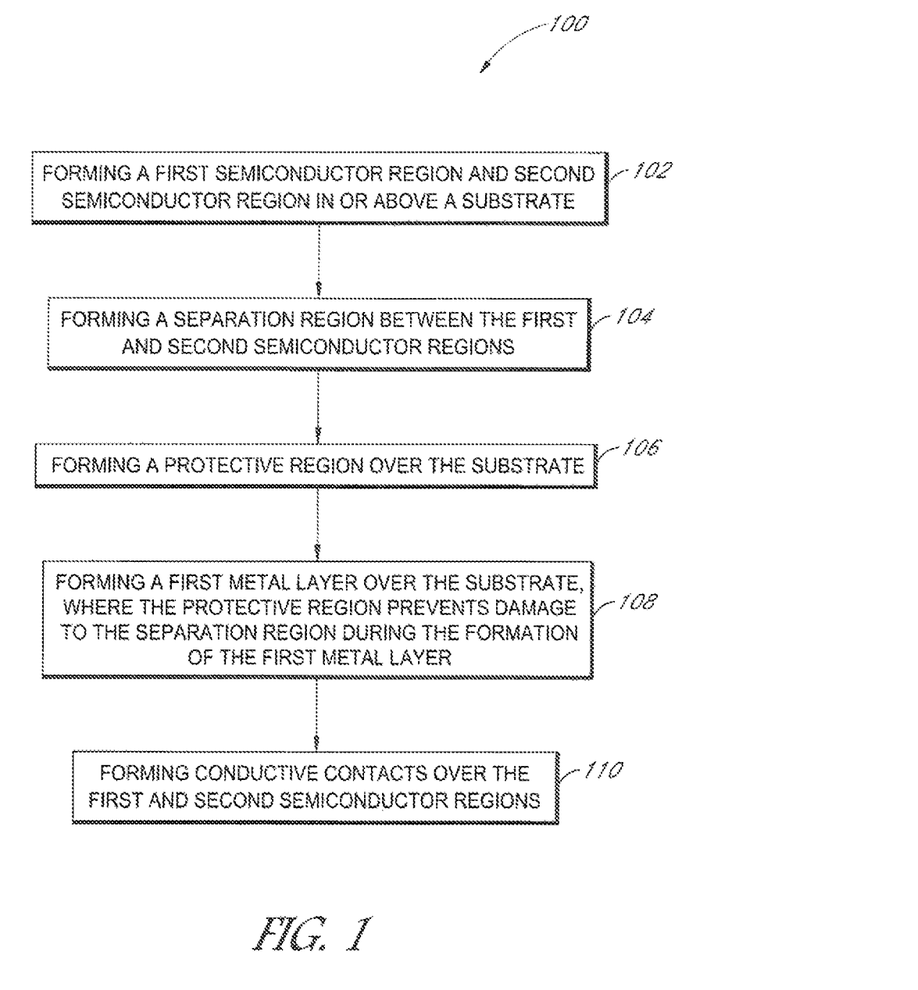
FIG. 1 illustrates a flow chart representation of an example method for fabricating a solar cell, according to some embodiments.

Disclosed herein are methods of fabricating solar cells. In an exemplary process flow, FIG. 1 illustrates a flowchart 100 listing operations in a method of fabricating a solar cell corresponding to FIGS. 4-14, according to some embodiments. In various embodiments, the method of FIG. 1 can include additional (or fewer) blocks than illustrated. For example, in some embodiments, an optional heating and/or annealing step can be performed after forming a first metal layer over the substrate, at block 108, prior to the formation of conductive contacts at block 110.

Figure 2:
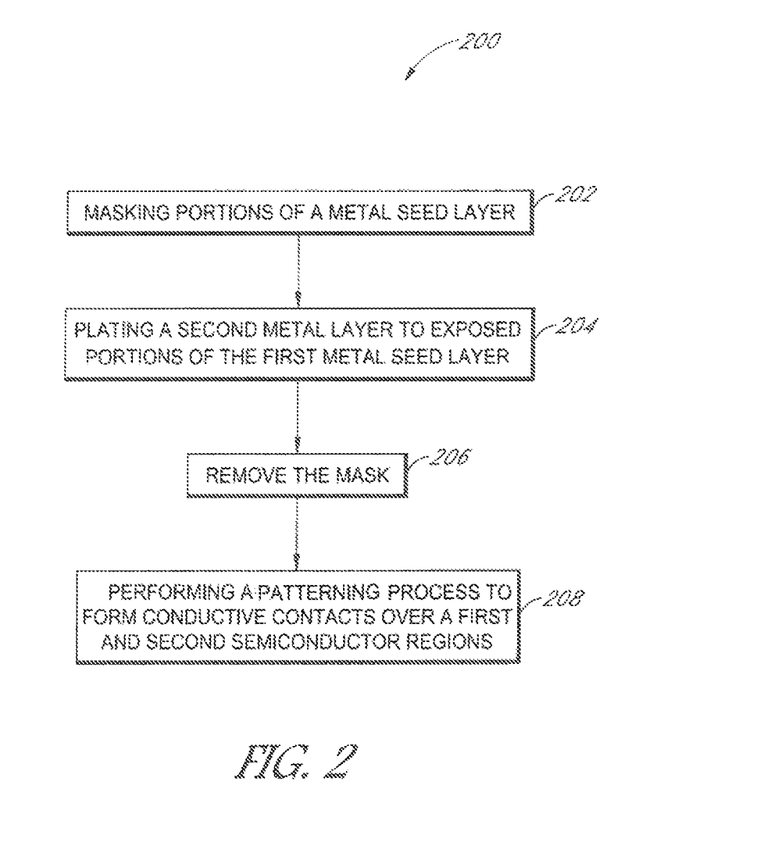
FIG. 2 illustrates a flow chart representation of an example method for forming conductive contacts for a solar cell, according to some embodiments.
Figure 3:
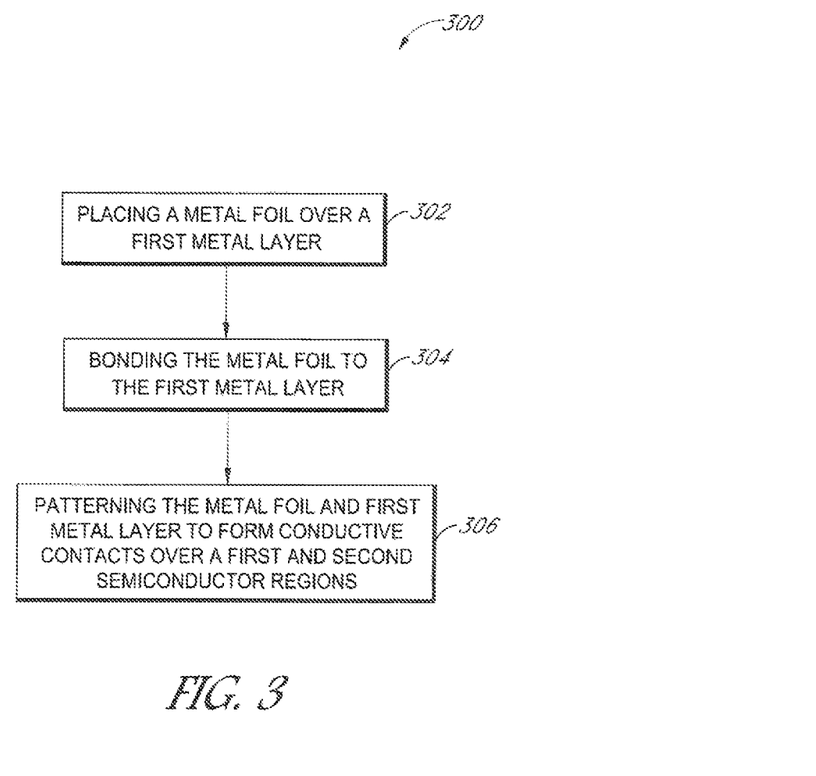
FIG. 3 illustrate a flow chart representation of another example method for forming conductive contacts for a solar cell, according to some embodiments.

As disclosed herein, a conductive contact can include a metal contact structure formed over a semiconductor region of a solar cell. In an embodiment, the conductive contact can also be referred to as a metal contact. In an example, a conductive contact and/or metal contact can include one or more metal layers. In one example, the conductive contact includes aluminum, titanium tungsten, tungsten, and/or copper, among other metals. FIGS. 2 and 3 below describe methods of forming conductive contacts.

Disclosed herein are methods for forming conductive contacts for solar cells. In a one exemplary process flow, FIG. 2 illustrates a flowchart 200 listing operations in one method for forming conductive contacts of a solar cell corresponding to FIGS. 9-12, according to some embodiments.

Also, disclosed herein is another method for forming conductive contacts for a solar cell. In a an exemplary process flow, FIG. 3 illustrates a flowchart 300 listing operations in a patterning process of a solar cell corresponding to FIGS. 13 and 14, according to some embodiments.

Figure 4:
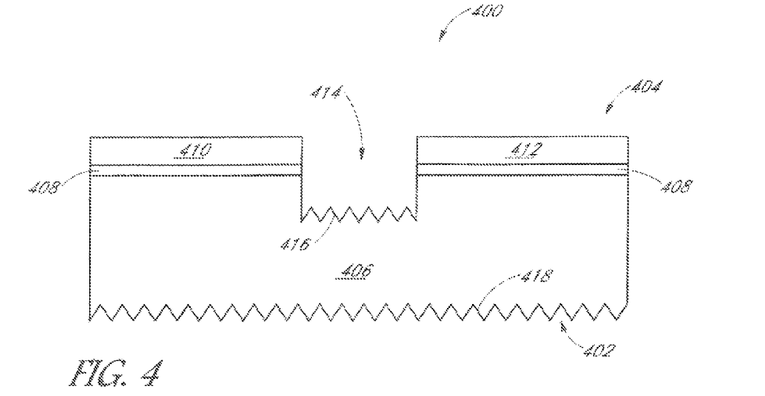
FIG. 4 illustrates a stage in solar cell fabrication following formation of semiconductor regions (emitter regions) formed above a substrate of a solar cell, according to some embodiments.

Embodiments described herein include fabrication of a solar cell 400 according to one or more of the above described approaches. Referring to FIG. 4 and corresponding operation 102 of flowchart 100, a first semiconductor region 410 and/or a second semiconductor region 412 can be formed in or above a substrate 406. In an example, as shown in FIG. 1, the substrate 406 has disposed there above a first semiconductor region 410 and a second semiconductor region 412. In some examples, the first and second semiconductor regions 410, 412 can be formed in the substrate 406. In an example, the first and second semiconductor regions 410, 412 are emitter regions. In an embodiment, a thin dielectric material 408 can be disposed between the first and second semiconductor region 410, 412 and the substrate 406. In an embodiment, the substrate 406 includes a light-receiving surface 418 on a front side 402 opposite a back side 404 of the solar cell 400.

In an embodiment, the substrate 406 is a monocrystalline silicon substrate, such as a bulk single crystalline N-type doped silicon substrate. It is to be appreciated, however, that substrate 406 may be a layer, such as a multi-crystalline silicon layer, disposed on a global solar cell substrate. In an embodiment, the thin dielectric layer 408 is a tunneling silicon oxide layer having a thickness of approximately 2 nanometers or less. In one such embodiment, the term "tunneling dielectric layer" refers to a very thin dielectric layer, through which electrical conduction can be achieved. The conduction may be due to quantum tunneling and/or the presence of small regions of direct physical connection through thin spots in the dielectric layer. In one embodiment, the tunneling dielectric layer is or includes a thin silicon oxide layer. In an embodiment, the first and second semiconductor regions 410, 412 are N-type and P-type emitter regions, respectively. In an example, the N-type and P-type emitter regions are formed in the substrate itself, in which case distinct semiconductor regions (such as regions 410 and 412) and the dielectric layer 406 would not be included.

In an embodiment, the first and second semiconductor regions 410 and 412, respectively, are formed polycrystalline silicon formed by, e.g., using a plasma-enhanced chemical vapor deposition (PECVD) process. In one such embodiment, the first semiconductor region 410 is doped with an N-type impurity, such as phosphorus (e.g., N-type semiconductor region). The second semiconductor region 412 is doped with a P-type impurity, such as boron (e.g., P-type semiconductor region).

Referring to FIG. 4 and corresponding operation 104 of flowchart 100, a separation region 414 can be formed between the first and second semiconductor regions 410, 412. In an embodiment, the separation region 414 is a trench region. In an embodiment, the separation region 414 extends partially into the substrate 406. In one embodiment, the separation region 414 is a passivation region.

In an embodiment, the light receiving surface 418, is a texturized light-receiving surface, as is depicted in FIG. 4. In one embodiment, a hydroxide-based wet etchant is employed to texturize the light receiving surface 418 of the substrate 406 and, possibly, the separation region surface 416 as is also depicted in FIG. 4. It is to be appreciated that the timing of the texturizing of the light receiving surface and separation region may vary. For example, the texturizing may be performed before or after the formation of the thin dielectric layer 408. In an embodiment, a texturized surface may be one which has a regular or an irregular shaped surface for scattering incoming light, decreasing the amount of light reflected off of the light receiving surfaces 416, 418 of the solar cell 400. In some embodiments, the light receiving surfaces 416, 418 need not be texturized.

Solar cell substrates can be susceptible to performance degradation during a solar cell metallization process. In an example, the deposition of a metal seed layer via metal sputtering can involve collision of highly energetic metal species and damaging plasma-induced radiation at the separation region 414 resulting in solar cell performance degradation. Thus, in an embodiment, approaches to prevent and/or inhibit metallization-induced damage at the separation region 414 of the substrate 406 are presented.

Figure 5:
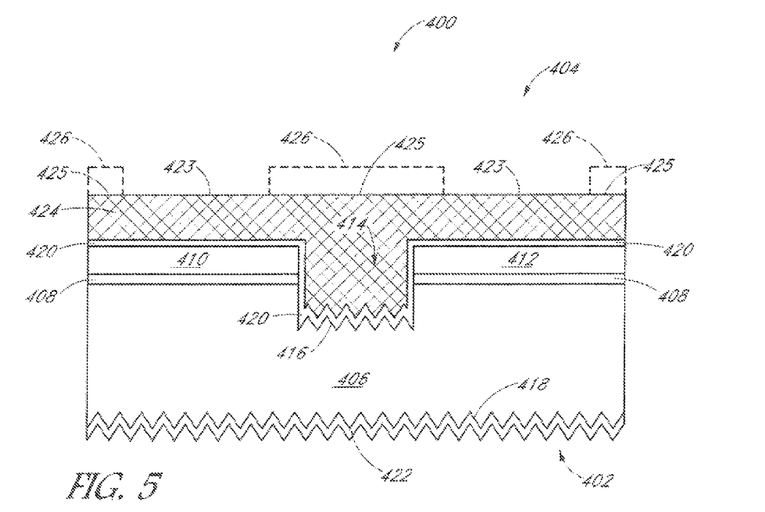
FIG. 5 illustrates the structure of FIG. 4 following forming of a protective layer above the substrate, according to some embodiments.
Figure 6:
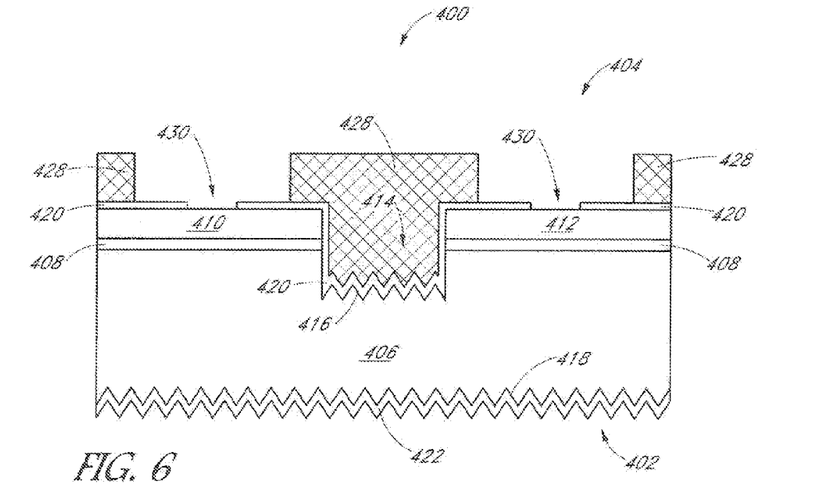
FIG. 6 illustrates the structure of FIG. 5 following patterning the protective layer, according to some embodiments.

Referring to FIG. 5, FIG. 6 and corresponding operation 106 of flowchart 100, a protective region is formed over the substrate 406. In an embodiment, the protective region 428 is formed over the separation region 414. In one embodiment, forming the protective region can include forming a blanket protective layer 424 over the substrate 406, as shown in FIG. 5, and subsequently patterning the blanket protective layer 424 to form the protective region 428 as shown in FIG. 6. In an embodiment, the blanket protective layer 424 includes a polymer. In an example, the blanket protective layer 424 includes a silicone, polymeric silsesquioxane, epoxy or acrylic. In an embodiment, the protective region 428 can include a material which does not include a pigment. In one example, the blanket protective layer 424 can be a blanket polysilicon layer. In one particular embodiment, for example where plated conductive contacts are formed, the protective region 428 can include reflective pigments such as titanium oxide (TiO2). In one particular embodiment, for example where plated conductive contacts are formed, the protective region 428 can include polyimide. In an embodiment, the patterning can include forming a mask 426 over portions 425 of the blanket protective layer 424. In an embodiment, subsequent to forming the mask 426, the patterning can include removing exposed portions 423 of the blanket protective layer 424, where the mask protects portions 425 of the blanket protective layer 424 during the patterning process. Subsequent to patterning, the mask 426 can be removed.

In an embodiment, the formation of the protective region 428 over the separation region 414 of the solar cell 400 can prevent and/or inhibit impingement of energetic ions and/or ionizing radiation into the solar cell 400 during a subsequent metallization process. In an example, ionizing radiation can include electromagnetic radiation such as in the ultraviolet (UV) and/or x-ray wavelengths. In one example, protective regions 428 can be used to inhibit the impingement of energetic ions and/or ionizing radiation over a trench and/or passivation region 414 of a solar cell 400 during a metal sputter deposition process. In the same example, the protective regions 428 can prevent and/or inhibit charge carrier lifetime loss at the trench and/or passivation region due to the impingement of energetic ions and/or ionizing radiation at those regions.

In an embodiment, prior to forming the blanket protective layer 424, an intervening layer 420 can be formed over the substrate 406. In an embodiment, the intervening layer 420 can also be referred to as an insulating layer. In one embodiment, the intervening layer 420 includes a back anti-reflective coating (BARC). In an example, the intervening layer 420 includes silicon nitride and/or amorphous silicon. Referring to FIG. 5, additional embodiments can include forming of a passivation and/or front anti-reflective coating (ARC) layer 422 on a light-receiving surface 418 at the front side 402 of the substrate 406. In an example, the front anti-reflective coating (ARC) layer 422 can include silicon nitride. It is to be appreciated that the timing of the formation of the intervening layer and/or ARC layers may also vary. For example, subsequent to forming the intervening layer (e.g., a BARC layer) on the back side 404 of the substrate 406, the ARC layer 422 can be formed on the front side 402. In one embodiment, the intervening layer 420 can be formed subsequently after the ARC layer 422. In some embodiments, both the intervening layer 420 and the ARC layer 422 can be formed in a single process (e.g., the same process step).

FIG. 6 illustrates a protective region 428 formed over the separation region 414 of the substrate 406, according to some embodiments. In one embodiment, and as discussed above, the protective region 428 can be formed from patterning a blanket protective layer 424, as described in FIG. 5. In an embodiment, other formation and/or patterning processes can be used. In an embodiment, the protective region 428 can formed directly as a pattern, e.g., in contrast to the mask and etching process described above. In an example, the protective region 428 is formed by a printing process. In one example, the protective region 428 is formed by screen printing and/or ink-jet printing. In an embodiment, the protective region 428 includes a polymer. In an example, the protective region 428 includes a silicone, polymeric silsesquioxane, epoxy or acrylic. In an embodiment, the protective region 428 can include a material which does not include a pigment. In an embodiment, the protective region 428 is a dielectric region. In an example, the dielectric region can include silicon oxide. In one embodiment, the protective region 428 is a polysilicon region. In an example, the polysilicon region can be an N-type doped or a P-type doped polysilicon region. In the embodiment where the protective region 428 is a polysilicon region, an insulating layer 420 can insulate the first semiconductor region 410, second semiconductor region 412 and/or the substrate 406 from the protective region 428. In an embodiment, the polysilicon region can be deposited and/or grown. In an embodiment, the protective region 428 includes a material stable at temperatures of at least 300 degrees Celsius. In an example, the protective region 428 includes a material that does not decompose, melt, undergo outgassing or otherwise deteriorate at temperatures of least 300 degrees Celsius. In an embodiment, the protective region 428 can prevent and/or inhibit damage to the separation region 414 at temperatures of at least 300 degrees Celsius. In an example, the formation of a protective region 428 can prevent and/or inhibit impingement of energetic ions and/or ionizing radiation into the solar cell during a metallization process. In an example, ionizing radiation can include electromagnetic radiation such as in the ultraviolet (UV) and/or x-ray wavelengths. In one example, the protective region 428 can be used to inhibit charge carrier lifetime degradation over a trench and/or passivation region of a solar cell during a metal sputter deposition process. In some embodiments, the protective region 428 can prevent and/or inhibit metallization-induced damage at the separation region 414 and/or polysilicon regions of the substrate 406.

Figure 7:
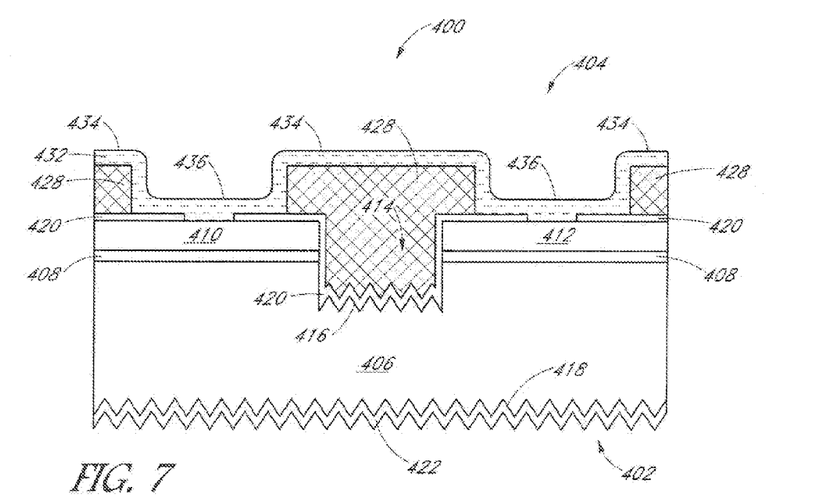
FIG. 7 illustrates the structure of FIG. 6 following forming a first metal layer over the substrate, according to some embodiments.

In an embodiment, openings 430 are formed in the intervening layer 420 to accommodate direct contact of a first metal layer to the first and/or second semiconductor regions 410 and 412 (e.g., as shown in FIG. 7). In an embodiment, openings are formed in the intervening layer 420 by a patterning process. In an example, a laser ablation, lithography and/or etching process can be performed to form the openings 430. In one embodiment, openings 430 in the intervening layer 420 can be formed prior to forming the protective layer 428 of FIG. 5. In an embodiment, the openings 430 in the intervening layer 420 can be formed prior to the formation of the protective region 428 of FIG. 6. In some embodiments, the openings 430 in the intervening layer 420 can be formed after to the formation of the protective region 428.

Referring to FIG. 7 and corresponding operation 108 of flowchart 100, a first metal layer 432 is formed over the substrate 406 (which may be referred to as a metal seed layer, or M1 layer, for the solar cell 400). In an example, forming the first metal layer 432 can include depositing the first metal layer 432 over the substrate 406. In an embodiment, the first metal layer 432 can be formed as an uninterrupted layer over the substrate 406. In an embodiment, the protective region 428 protects the separation region 414 during the formation of the first metal layer 432. In one embodiment, the protective region 428 can prevent and/or inhibit damage to the separation region 414 during the formation of the first metal layer 432. In an example, the protective region 428 prevent and/or inhibit metallization-induced damage at the separation region 414 of the substrate 406. In an embodiment, portions of the first metal layer 432 can contact the first and second semiconductor regions 410, 412 at openings (e.g., openings 430 shown in FIG. 6) of the intervening layer 420.

In an example, the first metal layer 432 is formed from a blanket deposition process. In one example, a sputtering process can be used to form the first metal layer 432. In an embodiment, the protective region 428 protects the separation region 414 during the sputtering process. In one embodiment, the protective region 428 can prevent and/or inhibit damage to the separation region 414 during the sputtering process. In an embodiment, the first metal layer 432 can include one or more metals and/or metal alloys. In an example, the first metal layer 432 can include aluminum, titanium tungsten, tungsten, and/or copper, among other metals.

In an embodiment, forming the first metal layer 432 can include performing a mask and etching process. In an example, a mask can be formed over portions 436 of the first metal layer. Subsequent to forming the mask, other portions 434 of the first metal layer 432 can be etched to remove the other portions 434 of the first metal layer. Subsequent to etching the first metal layer 432, the mask can be removed.

In one embodiment, the first metal layer 432 can instead be formed in a pattern, where the first metal layer 432 is formed directly over the first and second semiconductor regions 410, 412 (e.g., not as an uninterrupted layer or in contrast to performing a mask and etching process as described above). In an example, forming the first metal layer 432 can include forming a patterned metal seed layer. In an embodiment, the patterned metal seed layer can be formed in alignment with the first and second semiconductor regions 410, 412.

Figure 8:
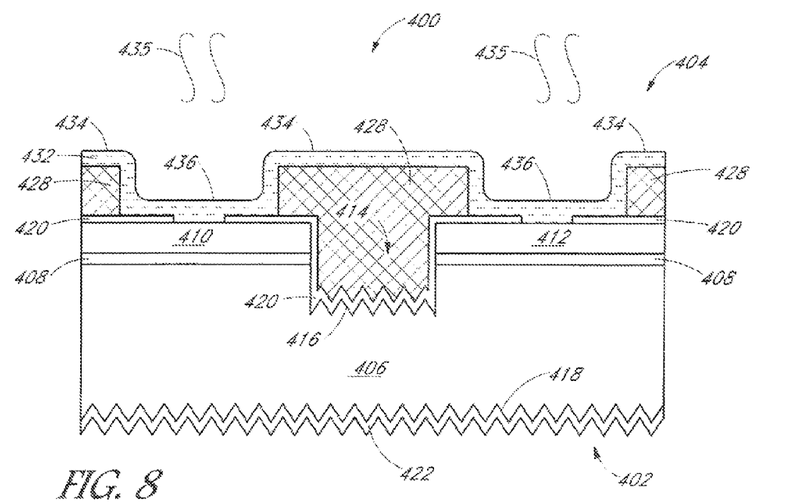
FIG. 8 illustrates the structure of FIG. 6 following heating the substrate, according to some embodiments.

Alternative embodiments used in the manufacture of solar cells can include forming the first metal layer 434 without a protective region 428. In this particular embodiment, energetic ions and ionizing radiation can impinge upon separation region 414 of the substrate 406 during metallization processes. In an example, ionizing radiation can include electromagnetic radiation such as in the ultraviolet (UV) and/or x-ray wavelengths. This metallization-induced damage at the separation region 414 can reduce charge carrier lifetime and cause overall solar cell performance degradation. One way to recover the charge carrier lifetime would be to perform an anneal at high temperatures, in an example, greater than 300 degrees Celsius. In this manner, materials used in the fabrication of the solar cell would be required to be thermally stable at high temperatures, e.g., exposure to greater than 300 degrees Celsius for a duration of 5-30 minutes. In an embodiment, forming the protective region 428, as described above, can eliminate the need for using a subsequent heating and/or annealing process to recover charger carrier lifetime lost subsequent to the formation of the first metal layer 432. In one embodiment, forming the protective region 428 allows for the use of fabrication materials on the solar cell that are thermally stable at temperatures less or equal to 300 degrees Celsius. In an embodiment, using the protective region 428 can allow for performing a reduced heating and/or annealing process subsequent to forming the first metal layer 434. In an example, the reduced heating and/or annealing process can be performed at temperatures less than or equal to 300 degrees Celsius. FIG. 8 illustrates performing an optional heating operation subsequent to forming the protective region 428.

Referring to FIG. 8, subsequent to forming the first metal layer 432, the substrate 406 can be heated 435. In an example, the substrate can be heated 435 at temperatures of less than or equal to 300 degrees Celsius. In an embodiment, heating 435 the substrate 406 can include performing an annealing process. Performing an annealing process can reduce contact resistance between the first metal layer 434 and the semiconductor regions 410, 412. In one embodiment, the protective region 428 can prevent and/or inhibit damage during the heating process 435. In an embodiment, the heating 435 need not be performed, where the protective region 428 can prevent and/or inhibit damage to the separation region 414 during the formation of the first metal layer 432 (e.g. during a sputtering process).

Referring to FIGS. 9-12, and corresponding operation 110 of flowchart 100, conductive contacts can be formed over the first and second semiconductor regions of the solar cell.

Figure 13:
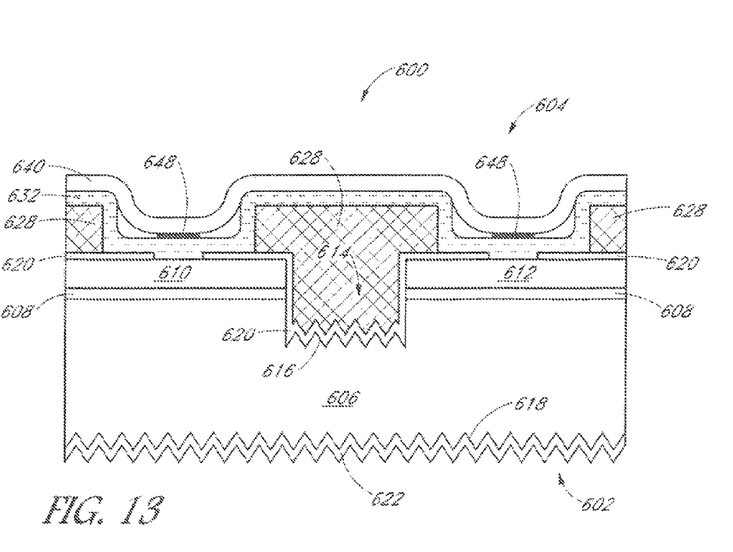
FIG. 13 illustrates cross-sectional view of example solar cells during a metal-foil based metallization process to form conductive contacts, according to some embodiments.
Figure 14:
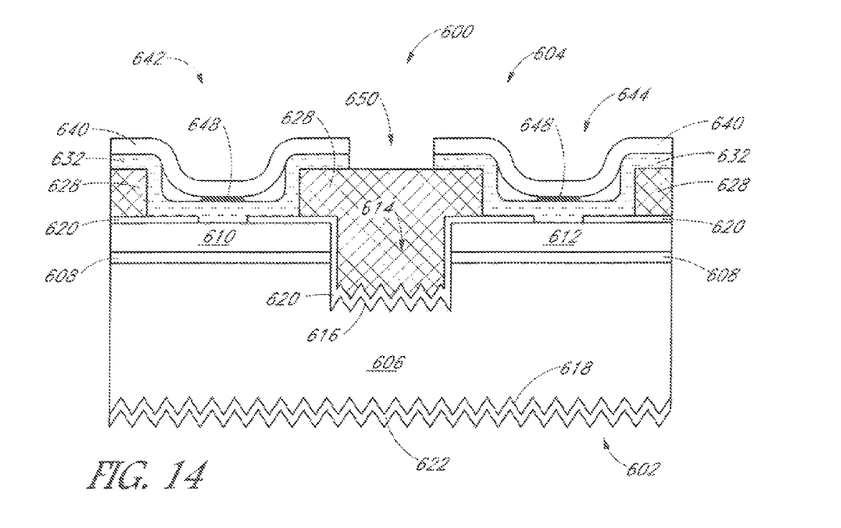
FIG. 14 illustrates a cross-sectional view of a solar cell formed from the method of FIGS. 1, 3-8 and 13, according to some embodiments.

In an exemplary process flow, FIGS. 9-12 illustrate cross-sectional views of various stages in one example method for forming conductive contacts for a solar cell, in accordance with an embodiment of the present disclosure. In an embodiment, the method of FIGS. 9-12 can include performing a plating and etching process. In an exemplary process flow, FIGS. 13 and 14 illustrate cross-sectional views of various stages in another method for forming conductive contacts for a solar cell, in accordance with an embodiment of the present disclosure. In an embodiment, the method of FIGS. 13 and 14 can include performing a metal foil based bonding and etching process.

In an exemplary process flow, FIG. 2 is a flowchart 200 listing operations in one example method for forming conductive contacts for a solar cell corresponding to FIGS. 9-12, according to some embodiments. As shown, the solar cell of FIGS. 9-12 have similar reference numbers to elements of the solar cell of FIGS. 4-8, where like reference numbers refer to similar elements throughout the figures. In an embodiment, the structure of the solar cell of FIGS. 9-12 is substantially similar to the structure of the solar cell of FIGS. 4-8, except as described below. Unless otherwise specified below, the numerical indicators used to refer to components in FIGS. 9-12 are similar to those used to refer to components or features in FIGS. 4-8 above, except that the index has been incremented by 100. Therefore the description of corresponding portions of FIGS. 4-8 applies equally to the description of FIG. 9-12, except as described below. In various embodiments, the method of FIG. 2 can include additional (or fewer) blocks than illustrated. For example, in some embodiments, a mask need not be removed at block 206, where the mask can instead be removed during an etching process at block 208. Accordingly, the exemplary process flow moves from the structure of FIG. 8 to the structure of FIG. 9.

Figure 9:
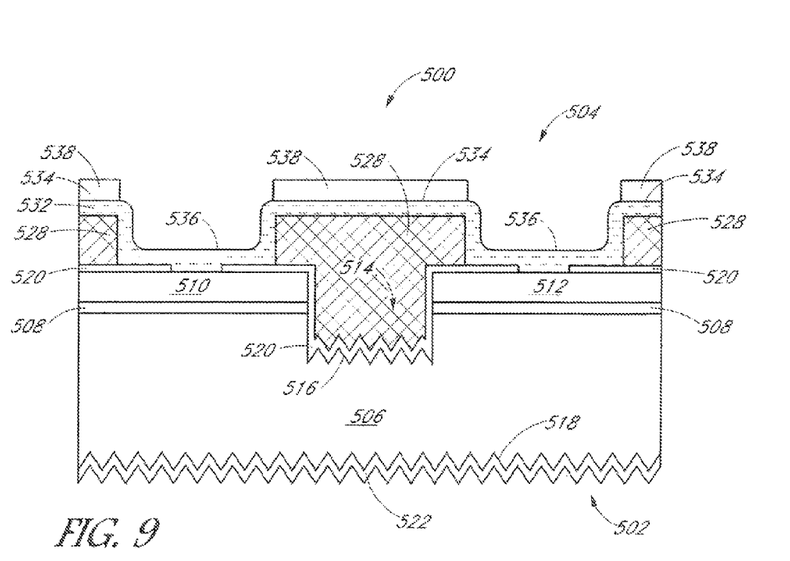
FIGS. 9 and 10 illustrate cross-sectional views of example solar cells during a plating process to form conductive contacts, according to some embodiments.

Referring to FIG. 9 and corresponding operation 202 of flowchart 200, a mask 538 can be formed over a first metal seed layer 532, according to some embodiments. In an embodiment, the mask 538 can protect portions 534 of the first metal layer 532 during a subsequent plating process, while exposed regions 536 can be plated during said plating process. In an embodiment, the mask 538 can be formed by screen printing, inkjet printing, among other printing processes. In one embodiment, the mask 538 can be an etch resist. In one embodiment, the etch resist can be an etch resist 538 commonly used in the fabrication or manufacture of solar cells. In some embodiments, the etch resist 538 is a plating resist.

Figure 10:
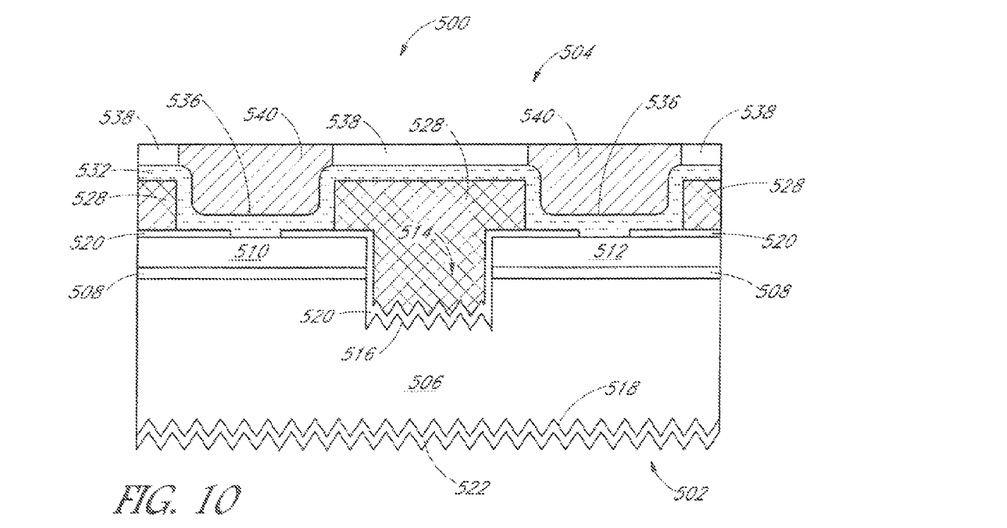

Referring to FIG. 10 and corresponding operation 204 of flowchart 200, a second metal layer 540 can be plated on exposed portions 536 of the first metal layer 532. In an embodiment, a plating process can be performed to form the second metal layer 540 on exposed portions 536 of the first metal layer 532, where the mask 538 can protect portions 534 of the first metal layer 532 during the plating process (534 shown in FIG. 9). In an example, copper, tin, and/or nickel, among other metals, can be plated to exposed portions 536 of the first metal layer 532.

Figure 11:
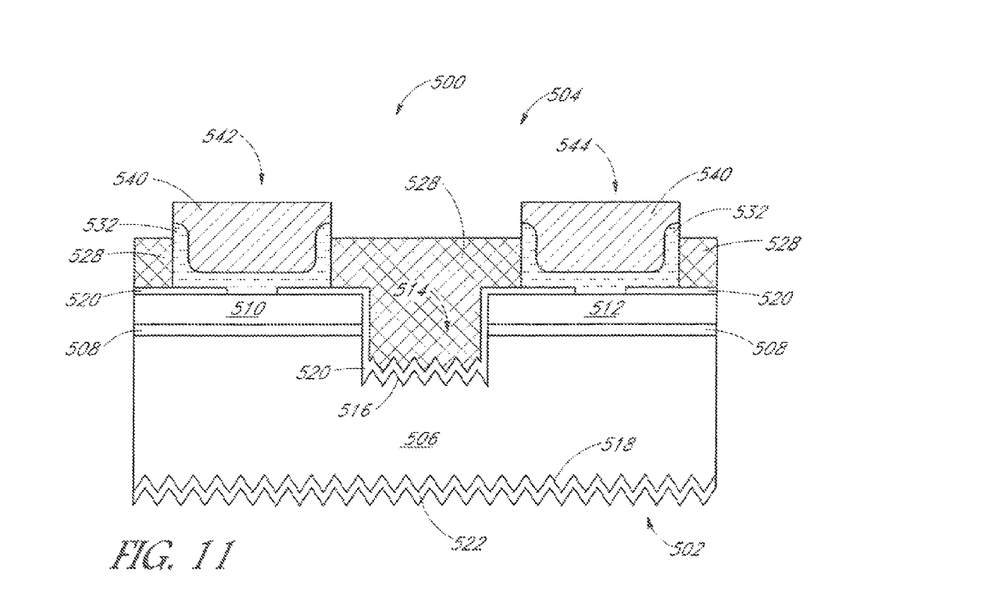
FIGS. 11 and 12 illustrate a cross-sectional view of solar cells formed from the method of FIGS. 1, 2 and 4-10, according to some embodiments.

Referring to FIG. 10, FIG. 11 and corresponding operation 206 of flowchart 200, the mask 538 of FIG. 10 can be removed. In an embodiment, the mask 538 can be removed using a wet chemical process. In an example, an ink stripping process can be performed to remove the mask 538.

Referring to FIG. 10, FIG. 11 and corresponding operation 208 of flowchart 200, the first metal layer 532 of FIG. 10 can be patterned to form a first conductive contact 542 and/or second conductive contact 544, respectively. In an embodiment, the patterning includes etching the first metal layer 532 of FIG. 10 using one or more etchants. In an embodiment, a hydroxide-based wet etchant can be used. In one example, the etchant can include potassium hydroxide, tetramethylammonium hydroxide, ammonium hydroxide and/or sodium hydroxide. In some embodiments, the etchant can include an etchant having a weight percent of greater than 2% potassium hydroxide. In an embodiment, referring to FIG. 10 and subsequent to removing the mask 538, portions 534 of the first metal layer 532 can be etched, where the second metal layer 540 can prevent etching other portions 536 of the first metal layer 532 during the etching process. As shown, the protective region 528 can be left over the separation region 514. In some embodiments, the patterning can include removing the protective region 528. In an example, an etching process can be performed to remove the mask 538 and, subsequently, the protective region 528. In an example, the etching processes discussed above can be used to remove the protective region 528. In an example, FIG. 11 shows a solar cell 500 with the protective region 528 and FIG. 12 shows a solar cell 500 subsequent to the removal of the protective region 528.

Figure 12:
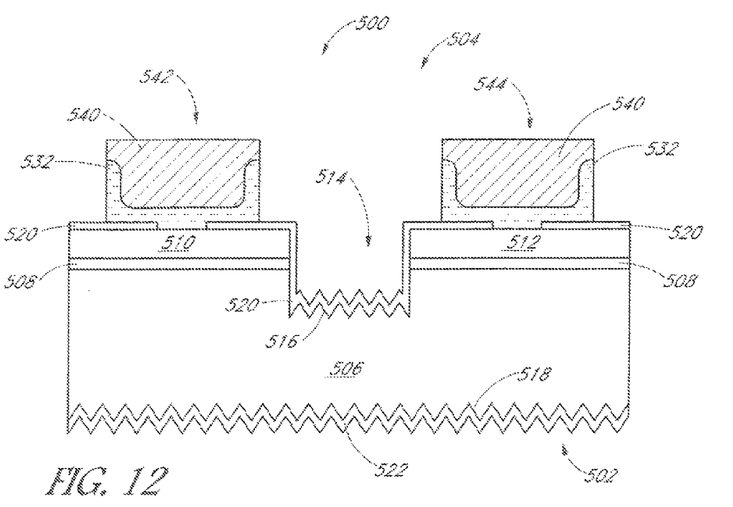

Referring to FIGS. 11 and 12, a solar cell 500 is shown fabricated using the methods of FIGS. 4-11 and corresponding to the operations of the flowcharts 100 and 200 of FIGS. 1 and 2, respectively. As shown, the solar cell 500 of FIGS. 11 and 12 have similar reference numbers to elements of the solar cell 400 of FIGS. 4-8, where like reference numbers refer to similar elements throughout the figures. In an embodiment, the structure of the solar cell 500 of FIGS. 11 and 12 are substantially similar to the structure of the solar cell 400 of FIGS. 4-8, except as described above. Unless otherwise specified below, the numerical indicators used to refer to components in FIGS. 11 and 12 are similar to those used to refer to components or features in FIGS. 4-10 above, except that the index has been incremented by 100. Therefore the description of corresponding portions of FIGS. 4-8 applies equally to the description of FIGS. 11 and 12. In an example, referring to FIGS. 4-8, FIG. 11, and FIG. 12, the first and second semiconductor region 410, 412 of FIGS. 4-8 can correspond to the first and second semiconductor region 510, 512 of FIGS. 11 and 12. In one example, referring to FIG. 8 and FIG. 11, the protective region 428 of FIG. 8 can correspond to the protective region 528 of FIG. 11.

Referring to FIGS. 11 and 12, in an embodiment, a solar cell 500 includes a substrate 506. In an embodiment, a first and second semiconductor regions 510, 512 are disposed in (not shown) or above (as shown) the substrate 506. In one embodiment, an intervening layer 520 is in alignment with locations between the first and second semiconductor regions 510 and 512. In an embodiment, the intervening layer 520 includes openings. Referring to FIG. 11, in one embodiment, a protective region 528 is disposed over separation regions 514. In an embodiment, the protective regions 528 include a polymer. In an example, the protective region 528 includes a polyimide, silicone, polymeric silsesquioxane, epoxy or acrylic. In an embodiment, a plurality of conductive contact structures 542, 544 are electrically connected to the first and second semiconductor regions 510 and 512. In an embodiment, the conductive contacts 542, 544 include a first metal layer 532 (e.g., a metal seed layer) and a second metal layer 540 (e.g., a plated metal layer). In an embodiment, the conductive contacts 542, 544 can be referred to as plated conductive contacts (e.g., at least a portion of the conductive contacts formed from a plating process). In one particular embodiment, for example where plated conductive contacts are formed, the protective region 428 can include reflective pigments such as titanium oxide (TiO2). In one particular embodiment, for example where plated conductive contacts are formed, the protective region 428 can include polyimide. In an embodiment, the protective regions 528 increase a solar energy absorbance efficiency of the solar cell 500. In one such embodiment, improved back side reflection of IR type wavelength light is achieved. That is, typical losses from IR transmission, in particular as seen the separation region 514 (e.g., textured trenches), may be recovered by using a reflective material on the rear side designed to reflect the longer wavelengths into the cell. Thus, in an embodiment, the protective regions 528 can include a reflective material. In an embodiment, the reflective material can include reflective pigments such as titanium oxide (TiO2) to reflect light, e.g., longer wavelengths, into the cell. In some embodiments, the protective region 528 of FIG. 11 is removed as shown in the solar cell 500 of FIG. 12.

In an exemplary process flow, FIG. 3 is a flowchart 300 listing operations in another example method for forming conductive contacts for a solar cell corresponding to FIGS. 13 and 14, according to some embodiments. As shown, the solar cell of FIGS. 13 and 14 have similar reference numbers to elements of the solar cell of FIGS. 4-8, where like reference numbers refer to similar elements throughout the figures. In an embodiment, the structure of the solar cell of FIGS. 13 and 14 are substantially similar to the structure of the solar cell of FIGS. 4-8, except as described below. Unless otherwise specified below, the numerical indicators used to refer to components in FIGS. 13 and 14 are similar to those used to refer to components or features in FIGS. 4-8 above, except that the index has been incremented by 200. Therefore the description of corresponding portions of FIGS. 4-8 applies equally to the description of FIGS. 13 and 14, except as described below. In various embodiments, the method of FIG. 3 can include additional (or fewer) blocks than illustrated. For example, in some embodiments, a mask can be formed before patterning at block 306 and subsequently removed after block 306. Accordingly, the exemplary process flow moves from the structure of FIG. 8 to the structure of FIG. 13.

Referring to FIG. 13 and corresponding operation 302 of flowchart 300, a metal foil 640 is placed over a first metal layer 632. In an embodiment, the metal foil is an aluminum foil. In an embodiment, the metal foil 640 can be pre-patterned and placed over the first and second semiconductor regions 610, 612. In an example, a patterned metal foil can be placed over the first and second semiconductor regions 610, 612. In one example, the patterned metal foil can follow a pattern in alignment with the first and second semiconductor regions 610, 612.

Referring to FIG. 13 and corresponding operation 304 of flowchart 300, the metal foil 640 of FIG. 13 is bonded or otherwise joined to the first metal layer 632. In an example, the bonding can include welding the metal foil 640 to the first metal layer 632. In an embodiment, the metal foil 640 is bonded to the first metal layer 632 at weld regions 648. In one such embodiment, the weld regions 648 are formed at locations above the first and second semiconductor regions 610 and 612, as is depicted in FIG. 13. In a specific such embodiment, a technique such as, but not limited to, a laser welding process, a thermal compression process or an ultrasonic bonding process is used to bond the metal foil 640 to the first metal layer 632.

In an embodiment, metal foil 640 is an aluminum (Al) foil having a thickness approximately in the range of 5-100 microns and, preferably, a thickness of less than approximately in the range of 50 microns. In one embodiment, the Al foil is an aluminum alloy foil including aluminum and second element such as, but not limited to, copper, manganese, silicon, magnesium, zinc, tin, lithium, or combinations thereof. In one embodiment, the Al foil is a temper grade foil such as, but not limited to, F-grade (as fabricated), O-grade (full soft), H-grade (strain hardened) or T-grade (heat treated).

Referring to FIG. 14 and corresponding operation 306 of flowchart 300, a patterning process is performed through the metal foil 640 in alignment with the locations between the first and second semiconductor regions 610 and 612 to isolate 650 regions of remaining metal foil 640 in alignment with the first and second semiconductor regions 610 and 612. In one embodiment, additional to preventing and/or inhibiting damage to a separation region 614 during the formation of a first metal layer, the protective region 628 can protect, and/or inhibit, damage to a separation region during the patterning process. In an embodiment, the patterning can include performing a laser ablation process. In an example, the laser ablating through the metal foil 640 involves using a laser having a wavelength. In an embodiment, the protective region 628 can include an opacifying pigment for scattering or absorbing light of the wavelength of the laser. In an embodiment, the laser ablation is performed mask-free; however, in other embodiments, a mask layer is formed on a portion of the metal foil 640 of FIG. 13 prior to laser ablating, and is removed subsequent to laser ablating. In an example, a mask can be formed prior to the patterning at block 306 and removed subsequent to the patterning at 306. In the embodiment where a patterned metal foil is used, the patterning process need not be performed.

Embodiments described herein include fabrication of a solar cell according to one or more of the above described approaches. Referring to FIG. 14, in an embodiment, a solar cell 600 includes a substrate 606. A first and second semiconductor regions 610, 612 are disposed in (not shown) or above (as shown) the substrate 606. An intervening layer 620 is in alignment with locations between the first and second semiconductor regions 610 and 612. In an embodiment, the intervening layer 620 includes openings. In one embodiment, a protective regions 628 includes a polymer. In an example, the protective region 628 includes a polyimide, silicone, polymeric silsesquioxane, epoxy or acrylic. A plurality of conductive contact structures 642, 644 are electrically connected to the first and second semiconductor regions 610 and 612. Each conductive contact structure 642, 644 includes a metal foil portion 640 disposed above and in alignment with a corresponding first and second semiconductor regions 610 and 612. In an embodiment, referring particularly to FIG. 14, each conductive contact structure 642, 644 further includes a first metal layer 632 (e.g., a metal seed layer) disposed directly between the corresponding one of the first and second semiconductor regions 610 and 612 and the metal foil portion 640. In an embodiment, the first metal layer 632 can contact the first and second semiconductor regions 610, 612 at the openings of the intervening layer 620.

Referring to FIG. 14, in an embodiment, the protective regions 628 increase a solar energy absorbance efficiency of the solar cell 600. In one such embodiment, improved back side reflection of IR type wavelength light is achieved. That is, typical losses from IR transmission, in particular as seen the separation region 614 (e.g., textured trenches), may be recovered by using a reflective material on the rear side designed to reflect the longer wavelengths into the cell. Thus, in an embodiment, the protective regions 628 can include reflective pigments such as titanium oxide (TiO2) to reflect light, e.g., longer wavelengths, into the cell.

In some embodiments, for example where the protective region 628 includes polysilicon, the protective region 628 can be removed. In one embodiment, the polysilicon region can be removed by a subsequent mask and etch process.

In an embodiment, although the solar cells 4-14 shown are back-side contact solar cells, the methods and structures described above can be used for front-side contact solar cells.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A method of fabricating a solar cell, the method comprising:
 forming a first and second semiconductor regions in or above a substrate, wherein a separation region is disposed between the first and second semiconductor regions;
 forming a polysilicon region over the separation region;
 forming an insulating layer between the polysilicon region and substrate, wherein the insulating layer includes openings;
 forming a first metal layer over the polysilicon region and the insulating layer and within the openings of the insulating layer, wherein the polysilicon region inhibits damage to the separation region during the formation of the first metal layer;
 forming conductive contacts over the first and second semiconductor regions; and
 removing the polysilicon region.

2. The method of claim 1, wherein forming the first metal layer comprises performing a sputtering process to form the first metal layer over the polysilicon region and the insulating layer and within the openings of the insulating layer, wherein the polysilicon region inhibits damage to the separation region during the sputtering process.

3. The method of claim 1, wherein the separation region is a trench region.

4. The method of claim 1, wherein forming the first metal layer comprises forming a metal seed layer over the polysilicon region and the insulating layer and within the openings of the insulating layer.

5. The method of claim 1, wherein forming the first metal layer comprises forming a patterned metal seed layer over the polysilicon region and the insulating layer and within the openings of the insulating layer.

6. The method of claim 1, wherein forming the polysilicon region over the separation region comprises depositing the polysilicon region over the separation region.

7. The method of claim 1, wherein forming the polysilicon region over the separation region comprises:
 forming a blanket polysilicon layer over the substrate;
 forming a mask over portions of the blanket polysilicon layer;
 etching exposed portions of the blanket polysilicon layer to form a polysilicon region over the separation region; and
 removing the mask.

8. The method of claim 1, wherein forming conductive contacts over the first and second semiconductor regions comprises:
 forming a mask over portions of the first metal layer;
 plating a second metal layer to exposed portions of the first metal layer;
 removing the mask; and
 performing an etching process to form conductive contacts over the first and second semiconductor regions.

9. The method of claim 1, wherein forming conductive contacts over the first and second semiconductor regions comprises:
 placing a metal foil over the first metal layer;
 bonding the metal foil to the first metal layer; and
 patterning the metal foil and first metal layer to form conductive contacts over the first and second semiconductor regions.

10. A method of fabricating a solar cell, the method comprising:
 forming a first and second semiconductor regions in or above a substrate, wherein a separation region is disposed between the first and second semiconductor regions;
 forming a protective region over the separation region;
 forming an insulating layer between the protective region and substrate, wherein the insulating layer includes openings;
 forming a first metal layer over the protective region and the insulating layer and within the openings of the insulating layer, wherein the protective region inhibits damage to the separation region during the formation of the first metal layer;
 forming a mask over portions of the first metal layer;
 plating a second metal layer to exposed portions of the first metal layer;
 removing the mask; and
 performing an etching process to form conductive contacts over the first and second semiconductor regions.

11. The method of claim 10, wherein forming a protective region over the separation region comprises forming a protective region thermally stable at temperatures of at less than or equal to 300 degrees Celsius.

12. The method of claim 10, wherein forming the first metal layer comprises performing a sputtering process to form the first metal layer over the protective region and the insulating layer and within the openings of the insulating layer, wherein the protective region inhibits damage to the separation region during the sputtering process.

13. The method of claim 10, further comprising:
 heating the substrate to a temperature of less than or equal to 300 degrees Celsius, wherein the protective region inhibits damage to the separation region during the heating.

14. The method of claim 10, wherein the separation region is a trench region.

15. The method of claim 10, wherein forming the first metal layer over the protective region and the insulating layer and within the openings of the insulating layer comprises forming a metal seed layer over the protective region, insulating layer and within the openings of the insulating layer.

16. The method of claim 10, wherein forming the protective region over the separation region comprises forming a polymer over the separation region.

17. The method of claim 16, wherein forming the polymer over the separation regions comprises forming a polyimide, silicone, polymeric silsesquioxane, epoxy or acrylic over the separation region.

* * * * *